May 7, 1963 J. B. NOE 3,089,098

STABILIZED TRANSISTOR AMPLIFIER

Filed Jan. 10, 1962

INVENTOR:
John B. Noe
BY
Roland A. Anderson
Attorney 3,089,098

STABILIZED TRANSISTOR AMPLIFIER

John B. Noe, Albuquerque, N. Mex., assignor, by mesne assignments, to the United States of America as represented by the United States Atomic Energy Commission Filed Jan. 10, 1962, Ser. No. 165,463
3 Claims. (Cl. 330—19)

Figure 1:
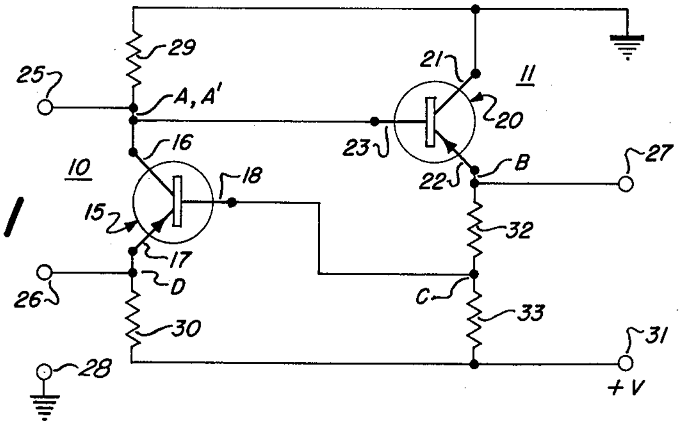

This invention relates generally to amplifier circuits and, more particularly to signal amplifier circuits utilizing a transistor and having a high degree of reliability.

Since the advent of missiles it has become increasingly important to design transistor amplifiers for use in key circuits, in which the possibility of failure or faulty operation is minimized or eliminated. The environmental conditions encountered are severe. Also, there may be many such circuits employed and space limitations must be considered.

There exist two-stage compensated transistor amplifier circuits wherein a stabilized signal is taken from an output transistor and coupled to the base of an input transistor. However, it has been found that all such circuits suffer from one or more shortcomings. In some instances the output is collector-loaded, creating inherent signal instability. Others introduce resistance or reactance in the feedback loop which limits the degree of compensation possible. Still others have a relatively fixed emitter-to-base bias in the compensating transistor which prevents operation of such transistor in a high impedance mode. These deficiencies, in addition to others avoided by the present invention, contribute to lessened effectiveness of stabilized transistor amplifiers with variation in environmental conditions such as temperature, shock and vibration, and variation in electrical characteristics of components.

It is therefore a general object of this invention to provide an improved signal amplifier circuit which efficiently utilizes transistors to furnish a highly stable output signal.

It is a further object of this invention to provide an improved transistor signal amplifier circuit having a stable emitter-follower output.

It is a still further object of this invention to provide an improved transistor signal amplifier circuit wherein an effective compensating signal is developed through a zero impedance path between the feedback source and the point of utilization.

It is yet another object of this invention to provide an improved transistor signal amplifier circuit wherein the compensating transistor is capable of operating in a high impedance mode.

One of the unique features of this invention is its dual capability as either an essentially unity voltage gain device or one of positive gain, the value of which can be controlled without critical selection of components.

Another object of this invention, therefore, is to provide an improved transistor signal amplifier having a voltage gain controllable independently of transistor characteristics within broad limits.

An amplifier circuit in accordance with the present invention comprises a pair of transistor amplifier stages connected in cascade relation, the first of which may be regarded essentially as an emitter-input, collector-output amplifier, and the second of which is operated as a base-input, emitter-output amplifier. A resistive voltage divider network is provided between the emitter of the second stage and a point of substantially fixed reference potential whereby a preselected portion of the output signal may be applied to the base of the first stage.

The emitter and collector of the first stage are connected respectively through separate series resistances to the source of fixed reference potential and to ground, such resistances being in predetermined ratio to each other. Direct connections are made between the collector of the first stage and the base of the second stage, between the collector of the second stage and ground, and between a preselected portion of the emitter resistance of the second stage and the base of the first stage. Separate input terminals are provided in the collector and the emitter of the first stage respectively, depending upon whether the device is to be used for unity gain or to furnish a finite voltage gain determined by the ratio of resistances in the voltage divider network in the second stage.

Figure 2:
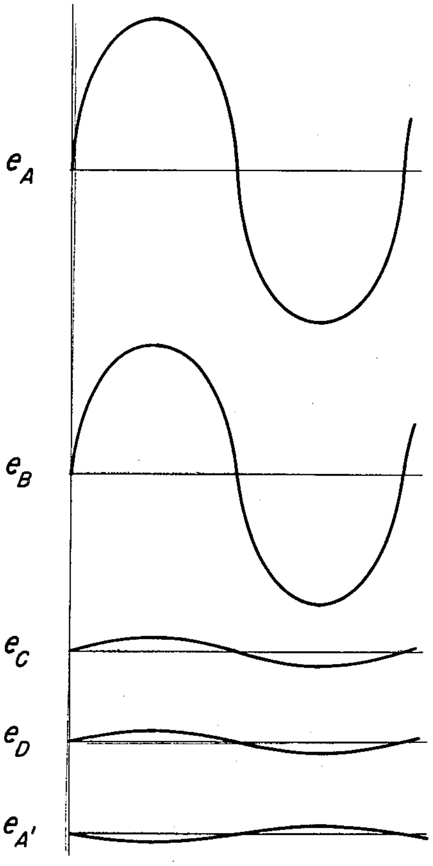

The novel features considered characteristic of this invention are set forth in the appended claims. The circuit of this invention, however, as to organization and method of operation as well as additional objects and advantages thereof will be best understood from the following description which should be read in conjunction with the attached drawings, in which:

FIG. 1 is a schematic circuit diagram of a complete transistor signal amplifier circuit embodying the present invention; and FIG. 2 represents a plot of typical voltage wave shapes of a sinusoidal signal at various stages in the circuit of this invention.

Referring now to the drawing, particularly to FIG. 1, a two-stage transistor signal amplifier circuit is shown comprising a first signal amplifier stage 10 and a second signal amplifier stage 11. The circuit may be, by way of example, a basic unit or module in a cascaded series of such circuits used to amplify the output of sensors such as piezoelectric devices, ferroelectric crystals, and ceramics. It should be understood, however, that the invention and application are not limited to amplification of signals from high impedance sources. Amplifying stages 10 and 11 are provided with transistors 15 and 20, respectively. Transistor 15 includes a collector electrode 16, an emitter electrode 17, and a base electrode 18, while transistor 20 includes a collector electrode 21, an emitter electrode 22, and a base electrode 23. Hereafter these transistors will be referred to as input transistor 15 and output transistor 20. Input transistor 15 and output transistor 20 are illustrated as being of the P-N-P type although it should be understood that by reversal of polarities N-P-N type transistors will work equally well.

Separate input terminals 25 and 26 are provided which are connected respectively to collector electrode 16 and emitter electrode 17 of input transistor 15. As will be seen from what follows, input terminal 25 will be employed if the device is to be used as a unity voltage gain emitter-follower circuit and terminal 26 will be employed where a positive voltage gain is desirable. A circuit ground terminal 28 may be provided to establish a reference potential for signal input at either terminal 25 or terminal 26. An output terminal 27 is provided at emitter electrode 22 of output transistor 20. This may be connected to any utilization device or to further stages of the same type if a multiplication of voltage gain is desired.

Collector electrode 16 and emitter electrode 17 are connected respectively through series biasing resistances 29 and 30 to ground and to a source of energizing potential 31. A voltage divider network consisting of resistances 32 and 33, which in combination provide proper biasing, is connected in series between emitter electrode 22 and potential source 31. Direct connections are established between collector 16 of input transistor 15 and base electrode 23 of output transistor 20, between collector 21 of output transistor 20 and ground, and between base 18 of input transistor 15 and the junction of resistances 32 and 33.

For effective operation of this circuit the steady state potential at emitter 22 of output transistor 20 may conveniently be approximately half of the value of the fixed source potential 31. This will insure that output transistor 20 is enabled to operate over the maximum linear portion of its dynamic range. Output transistor 20 initially has a forward emitter-base bias which in combination with the total value of emitter biasing resistance of resistances 32 and 33 will produce the desired potential at emitter 22. In order to insure maximum efficiency of operation of input transistor 15, the steady state potential drop across transistor 15 may have a value close to the midpoint between the value of source potential 31 and ground. Consistent therewith, a typical voltage drop across resistor 30 will be approximately 1 volt providing an initial potential at collector 16 slightly negative with respect to emitter 22 of output transistor 20, thus insuring the required forward emitter-base bias on that transistor as referenced above.

The inventor has found that the selection of resistance values in the circuit of this invention is important in a relative sense. The ratio of values of resistance 29 and resistance 30 will control the bias voltage on base electrode 23 of output transistor 20. In a particular embodiment of this circuit it was found convenient to make this ratio approximately 10 to 1. Similarly, the desired voltage gain of the circuit is controlled by the ratio of values of resistances 32 and 33. In the same embodiment referenced above, this latter ratio was also approximately 10 to 1. The above-mentioned ratios are illustrative of practical minimum values thereof consistent with efficient operation of this circuit. The invention is, however, not to be construed as limited to the arrangement or selection of resistance ratio values precisely adhering to the cited minimums. This choice will rather be governed by the particular environment in which the circuit is employed. Resistances 29 and 30 should be chosen in order to insure that the steady state collector current for input transistor 15 is of the same order of magnitude as the $I_{co}$, the collector current flowing when the base circuit is open. Typically, to provide for operation of input transistor 15 in such a high impedance mode, the combined values of resistances 29 and 30 will be relatively large with respect to the total of resistances 32 and 33. The temperature sensitivity of a transistor increases as its collector current approaches the value of $I_{co}$. Therefore, the particular ratio of total resistance values in amplifying stages 10 and 11 will depend upon the desired relative temperature sensitivity of these two stages. Again, any intent to limit the scope of this invention to the choice of a precise ratio of such combined values is expressly disclaimed.

The operation of the circuit of this invention may now be explained with the aid of the various voltage wave forms shown in FIG. 2. Each such wave form is identified by a reference letter corresponding to its location in the circuit.

Consider now the effect of a sinusoidal signal applied between terminal 25 and circuit ground terminal 28. Wave form $e_A$ represents such an input signal. As emitter-base bias on output transistor 20 decreases (during the initial positive going portion of $e_A$), the corresponding emitter and collector currents will also decrease causing the potential on emitter electrode 22 to move in a positive direction. Since output transistor 20 is connected as an emitter-follower, the signal appearing at output terminal 27 or $e_B$ will be in phase with $e_A$ and diminished only by the particular value of current gain characteristic of output transistor 20 which will normally be some value slightly less than unity. The potential $e_C$ at the junction of resistances 32 and 33 will also rise in phase with the previously mentioned potentials to a relative amplitude determined by the ratio of resistances 32 and 33. As a result, the potential on base 18 of input transistor 15 will rise, tending to decrease the emitter-to-base bias on that transistor. This will in turn cause decreased collector and emitter current flow in input transistor 15, thus reducing the potential drops across resistances 29 and 30. In this way the potential at emitter electrode 17 will be driven in a positive direction and the potential at collector electrode 16 will be driven in a negative direction. It has been observed that the emitter potential $e_D$ as shown in FIG. 2, will be in phase with $e_C$ at a slightly reduced amplitude due to the voltage divider effect of resistance 30 in combination with the emitter-to-base impedance of transistor 15. The fact that $e_D$ is in phase with $e_C$ tends to limit the decrease in collector current of input transistor 15 in the presence of a positive-going signal. The combination of the reduced potential across resistance 30 and the increased potential drop across transistor 15 produces a feedback potential $e_{A'}$, at collector 16 which is 180 degrees out of phase with $e_D$ and a slightly smaller amplitude. It should now be apparent that the value of $e_A$ as shown in FIG. 2 is affected by the amount of feedback voltage $e_{A'}$.

The operation of the circuit is entirely consistent with the above analysis in the event of a signal input applied between terminal 26 and circuit ground terminal 28 which will normally be employed if the circuit is to be used to obtain a positive voltage gain. In this case the input signal will be essentially the same as $e_D$, the potential at emitter electrode 17. The resulting wave shapes $e_A$ and $e_B$ will be in the same ratio to $e_D$ as before. This ratio is precisely determined by the ratio of resistances 32 and 33 so that, for example, in the particular embodiment of this circuit referenced above, a voltage gain of 10 would be produced. It is now apparent that the inventor has devised a novel means for establishing and controlling the voltage gain of a transistor circuit which is virtually independent of the particular gain characteristics of the transistors employed. It must be emphasized, however, at this point that these results are achieved only in the presence of an essentially zero impedance path from feedback source to signal input with respect both to direct and alternating currents. Series impedance in the feedback loop or base input to transistor 20 will tend to counteract the effect of an increased feedback current. This would adversely affect the bias on both input and output transistors, thus changing the operating points and adversely affecting dynamic range. By contrast, in the present circuit the bias of input stage 10 is directly dependent upon the operating point of output stage 11 and vice versa. Also, one could not maintain a constant voltage gain in the presence of wide temperature variation unless a zero A.C./D.C. feedback loop were provided.

Consider now the effect of temperature variation upon the operation of the circuit. Let us assume, for example, that a rise or increase in temperature occurs at output transistor 20. This will result in an increase in collector and emitter current at such transistor. The increased potential drop across resistances 32 and 33 will produce a negative-going change in output potential at terminal 27. At the same time the voltage at the junction of resistances 32 and 33 will also be driven in a negative direction. The correspondingly decreased potential at base 18 of input transistor 15 will produce an increased emitter-to-base bias on input transistor 15 which will in turn increase both emitter and collector currents. The increased potential drop across resistor 29 will cause a corresponding rise in potential at base 23 of output transistor 20. The resulting decreased emitter-to-base bias on transistor 20 will tend to decrease emitter and collector currents in that transistor and drive the potential at output terminal 27 in a positive direction, thus counteracting or compensating for the initial change.

At the same time, of course, we may assume that transistor 15 is experiencing a similar temperature environment. However, we have preferably set up initial operating conditions such that the temperature sensitivity of transistor 15 will be controllably greater than that of output transistor 20. This is due to its typical operation in a high impedance mode. The increased emitter and collector currents associated with the temperature increase in transistor 15 produce a decreased emitter base bias for output transistor 20 tending to drive the potential at output terminal 27 in a positive direction. The greater temperature sensitivity of transistor 15 will insure that compensation takes place rapidly. However, as the output potential is returned to its original value, the feedback loop between transistor 15 and transistor 20 will tend to inhibit overcompensation which would otherwise produce an output voltage error in the opposite direction. Obviously, if the emitter and collector currents of transistors 15 and 20 should change because of any other factors affecting their operation in substantially the same manner, these internal circuit changes will be automatically compensated in a manner similar to that described above. It is also obvious that all operations described herein would be entirely similar in the event of signals or temperature variations of polarities the reverse of those described.

It can be shown that the input impedance of this circuit with an input at terminal 25 is approximately equal to one-half the value of resistance 29. With a signal input at terminal 26, the circuit input impedance is approximately equal to half the value of resistance 30, and thus it becomes a simple matter to provide proper matching with varying source impedances.

By way of example, the following circuit specifications were used for a circuit of the type illustrated in FIG. 1. It is understood that these values and types are only illustrative of a preferred embodiment of the invention and are in no sense intended to define or limit the scope thereof.

| Reference numeral: | | Value or type |
|---|---|---|
| 15 | | 2N413–417 |
| 20 | | 2N413–417 |
| 29 | ohms | 100,000 |
| 30 | do | 10,000 |
| 31 | volts | 30 |
| 32 | ohms | 10,000 |
| 33 | do | 1,000 |

With this circuit the input connection for a voltage gain of 1 is at input terminal 25. For a voltage gain of 10, the input connection is at input terminal 26. Input impedance for a signal input at terminal 25 is approximately 50,000 ohms and for signal input at terminal 26 is approximately 5,000 ohms.

A circuit of this type may be used to drive another similar circuit, the maximum voltage gain obtainable being limited only by the noise factor. For example, with the values listed above, with 6 such amplifiers, one can obtain a voltage gain of $10^6$ wherein the output contains approximately 5 volts peak-to-peak of noise. The maximum output amplitude in this case is about 10 volts R.M.S. and current consumption is about 1.5 to 2 milliamperes. Treated as an amplifier with a voltage gain of 10, distortion at full output is on the order of 0.25%, and as a stabilized emitter-follower with a voltage gain of 1, the distortion is less than 0.05%. Using germanium transistors, such an amplifier will operate with very little change in characteristics to about 250° F. Individual units designed in accordance with this information have been operated while the temperature was being cycled between −100° F. and +400° F. almost continuously for three weeks held at high temperature for as long as an hour each time, and then exposed to 5 bursts of fixed neutron radiation on the order of $6\times10^{12}$ neutrons/cm.$^2$ per burst. Under these circumstances heat testing was resumed with no significant change noted in any of the original characteristics.

In summary, it may now be stated that a transistor signal amplifier circuit has been described possessing unique stability in the presence of changing environmental conditions and other factors causing like effects on corresponding transistor parameters. The use of series A.C. or D.C. impedances in the feedback loop which have adverse effects upon the voltage gain characteristics and dynamic operating range of the transistors has been avoided. Voltage gain is controlled through the ratio of output transistor emitter biasing resistances in a unique fashion and noise and distortion in the output are kept to very low values, while preserving the inherent stability of the emitter-follower output. The unique control obtainable with this circuit depends importantly upon the fact that the input transistor is not connected in any of the conventional configurations.

What is claimed is:

1. A signal amplifier circuit providing a highly stable output signal comprising in combustion a first and a second transistor connected in cascade relation, each of said transistors including collector, base and emitter electrodes, a first and a second input circuit coupled with the collector and emitter electrodes respectively of the first transistor, an output circuit coupled with the emitter electrode of the second transistor, a source of circuit energizing potential, a first and a second biasing resistance connecting the collector and emitter electrodes of said first transistor respectively with ground and the source of energizing potential, said resistances being in predetermined ratio to each other, a third and a fourth resistance forming a voltage divider network connected in series between the emitter electrode of the second transistor and the source of energizing potential, said third and fourth resistances being in predetermined ratio to each other, means for establishing direct couplings between the collector electrode of the first transistor and the base of the second transistor, between the collector electrode of the second transistor and ground, and between the junction of the third and fourth resistances of the second transistor and the base electrode of the first transistor respectively.

2. A signal amplifier circuit as defined in claim 1 wherein the value of the first resistance is relatively large with respect to the value of the second resistance.

3. A signal amplifier circuit as defined in claim 1 wherein the value of the third resistance is relatively large with respect to the value of the fourth resistance.

No references cited.